United States Patent
Shin

(10) Patent No.: US 8,234,036 B2
(45) Date of Patent: Jul. 31, 2012

(54) METHOD AND APPARATUS FOR STARTER MOTOR DIAGNOSIS AND PROGNOSIS USING PARAMETER ESTIMATION ALGORITHM

(75) Inventor: Kwang-Keun Shin, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 480 days.

(21) Appl. No.: 12/432,556

(22) Filed: Apr. 29, 2009

(65) Prior Publication Data

US 2009/0309530 A1 Dec. 17, 2009

Related U.S. Application Data

(60) Provisional application No. 61/061,880, filed on Jun. 16, 2008.

(51) Int. Cl.
*G01M 17/00* (2006.01)
(52) U.S. Cl. ...................... 701/32.9; 701/31.9; 701/34.4; 324/765.01
(58) Field of Classification Search .................. 701/29; 324/765.01, 545; 318/490; 322/99
See application file for complete search history.

(56) References Cited

U.S. PATENT DOCUMENTS

| | | | |
|---|---|---|---|
| 5,420,523 A * | 5/1995 | Walker et al. ............ | 324/765.01 |
| 5,430,362 A | 7/1995 | Carr et al. | |
| 5,646,341 A * | 7/1997 | Schricker et al. .......... | 73/114.57 |
| 5,970,937 A | 10/1999 | Casellato et al. | |
| 6,331,762 B1 * | 12/2001 | Bertness ....................... | 320/134 |
| 6,529,135 B1 * | 3/2003 | Bowers et al. ................ | 340/648 |
| 6,868,358 B2 * | 3/2005 | Brown, Jr. ..................... | 702/138 |
| 7,055,483 B2 | 6/2006 | Lewis et al. | |
| 7,308,322 B1 * | 12/2007 | Discenzo et al. ............... | 700/28 |
| 7,383,165 B2 * | 6/2008 | Aragones ......................... | 703/8 |
| 7,539,549 B1 * | 5/2009 | Discenzo et al. ............... | 700/28 |
| 7,917,333 B2 * | 3/2011 | Grichnik et al. .............. | 702/182 |
| 7,962,256 B2 * | 6/2011 | Stevens et al. .................. | 701/22 |
| 2003/0025481 A1 * | 2/2003 | Bertness ........................ | 320/155 |
| 2003/0038637 A1 * | 2/2003 | Bertness et al. .............. | 324/426 |
| 2003/0114965 A1 * | 6/2003 | Fiechter et al. ................. | 701/29 |
| 2005/0057865 A1 * | 3/2005 | Veloo et al. ...................... | 361/56 |
| 2007/0067678 A1 * | 3/2007 | Hosek et al. .................... | 714/25 |
| 2007/0069734 A1 * | 3/2007 | Bertness ......................... | 324/411 |
| 2007/0159177 A1 * | 7/2007 | Bertness et al. .............. | 324/426 |
| 2008/0039993 A1 * | 2/2008 | Cleary et al. .................... | 701/29 |
| 2008/0041327 A1 | 2/2008 | Lewis et al. | |
| 2008/0097662 A1 * | 4/2008 | Volponi ........................... | 701/29 |
| 2008/0243328 A1 * | 10/2008 | Yu et al. ........................... | 701/29 |

(Continued)

*Primary Examiner* — David Dunn
*Assistant Examiner* — David E Allred
(74) *Attorney, Agent, or Firm* — John A. Miller; Miller IP Group, PLC

(57) ABSTRACT

A system and method for determining the state of health of a starter motor to notify a vehicle driver of a potential starter motor failure before the failure actually occurs. The starter motor includes an armature and motor brushes each providing a resistance, and an armature coil providing an armature inductance. Further, the starter motor has a back EMF because of the starter motor being coupled to a flywheel and the vehicle engine. The system and method monitor the combined resistance of the armature and the motor brushes, the inductance of the armature and a back EMF constant of the motor, and provide a signal indicating a potential starter motor failure if any of these three values significantly deviates from nominal values. In one embodiment, the analysis of the motor resistance, armature inductance and back EMF constant is provided by a regression model to determine estimated motor parameters.

20 Claims, 4 Drawing Sheets

U.S. PATENT DOCUMENTS

2008/0243329 A1* 10/2008 Hamel et al. .................... 701/29
2009/0048730 A1* 2/2009 Akkaram et al. ............... 701/29
2009/0062978 A1* 3/2009 Picard ............................ 701/29
2010/0147039 A1* 6/2010 Thorn et al. ................. 68/12.16
2010/0169030 A1* 7/2010 Parlos ............................ 702/58
2011/0173496 A1* 7/2011 Hosek et al. .................... 714/26

* cited by examiner

METHOD AND APPARATUS FOR STARTER MOTOR DIAGNOSIS AND PROGNOSIS USING PARAMETER ESTIMATION ALGORITHM

CROSS-REFERENCE TO RELATED APPLICATIONS

This application claims the benefit of the priority date of U.S. Provisional Patent Application Ser. No. 61/061,880, titled Method and Apparatus for Starter Motor Diagnosis and Prognosis Using Parameter Estimation Algorithm, filed Jun. 16, 2008.

BACKGROUND OF THE INVENTION

1. Field of the Invention

This invention relates generally to a system and method for determining the state of health of a starter motor in a vehicle and, more particularly, to a system and method for determining the state of health of a starter motor in an internal combustion engine vehicle that employs a parameter estimation algorithm for determining starter motor resistance, inductance and back electro-motive force (EMF).

2. Discussion of the Related Art

As is well understood in the art, internal combustion engines typically employ a starter motor that is electrically coupled to a vehicle battery. When the ignition switch is turned on, battery power is provided to the starter motor, which rotates a motor shaft that rotates a flywheel. The flywheel rotates an engine shaft that in combination with fuel being provided to the engine causes the engine to be started so that operation of the engine can be sustained. The starter motor includes many components, including a motor armature, a motor stator, motor brushes, and other electrical components that define the motor. One or more of these components could fail as a result of many different situations where the starter motor will not operate properly, and thus, the vehicle may not start. For example, motor operation may be degraded or the motor may fail as a result of a dirty or bad brush, a short circuit of the armature coil, a weakened motor magnetic field as a result of the degradation of a permanent magnet in the motor, etc. Therefore, it is desirable to predict starter motor failure in advance of the actual failure so remedial actions can be taken before the vehicle driver is unable to start the vehicle.

SUMMARY OF THE INVENTION

In accordance with the teachings of the present invention, a system and method are disclosed for determining the state of health of a starter motor in an internal combustion engine vehicle so that the vehicle driver can be notified of a potential starter motor failure before the failure actually occurs. The starter motor includes an armature and motor brushes each providing a resistance, and an armature coil providing an armature inductance. Further, the starter motor has a back EMF because of the starter motor being coupled to a flywheel and the vehicle engine. The system and method monitor the combined resistance of the armature and the motor brushes, the inductance of the armature and a back EMF constant of the motor, and provide a signal indicating a potential starter motor failure if any of these three values significantly deviates from nominal values. In one embodiment, the analysis of the motor resistance, armature inductance and back EMF constant is provided by a regression model to determine estimated motor parameters. The regression model can employ a recursive least squares algorithm or a batch least squares algorithm.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for determining the state of health of a starter motor in an internal combustion engine vehicle is merely exemplary in nature and is no way intended to limit the invention or its applications or uses.

Figure 1:
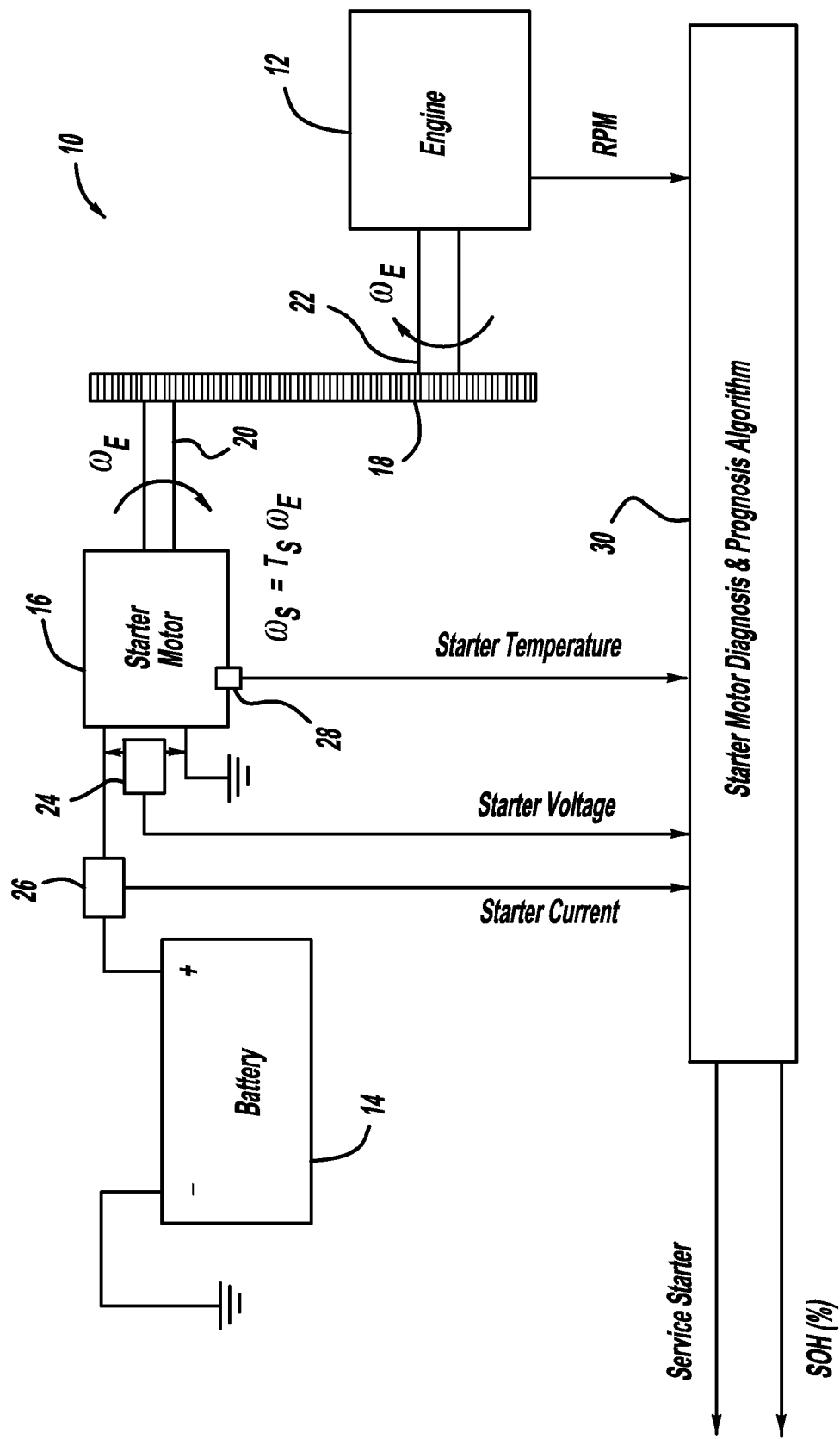
FIG. 1 is a schematic block diagram of a vehicle starting system including a starter motor and a controller for determining starter motor state of health.

FIG. 1 is a schematic block diagram of a starting system 10 for a vehicle. The starting system 10 includes a vehicle engine 12, a battery 14 and a starter motor 16, such as a permanent magnet starter motor of the type well known to those skilled in the art. The starter motor 16 is coupled to a flywheel 18 by a rotatable motor shaft 20 and the flywheel 18 is coupled to the engine 12 by a rotatable engine shaft 22. A voltage sensor 24 measures the voltage $V_m$ across the starter motor 16 and a current sensor 26 measures the current flow $I_a$ from the battery 14 to the starter motor 16. Also, a temperature sensor 28 measures the temperature T of the starter motor 16. As will be discussed in detail below, the system 10 includes a diagnosis and prognosis controller 30 that receives the starter current signal $I_a$ from the current sensor 26, the starter voltage signal $V_m$ from the voltage sensor 24, an engine speed signal $\omega_E$ from the engine 12 and the temperature signal T from the temperature sensor 28, and provides an indication of the state of health of the starter motor 16.

Figure 2:
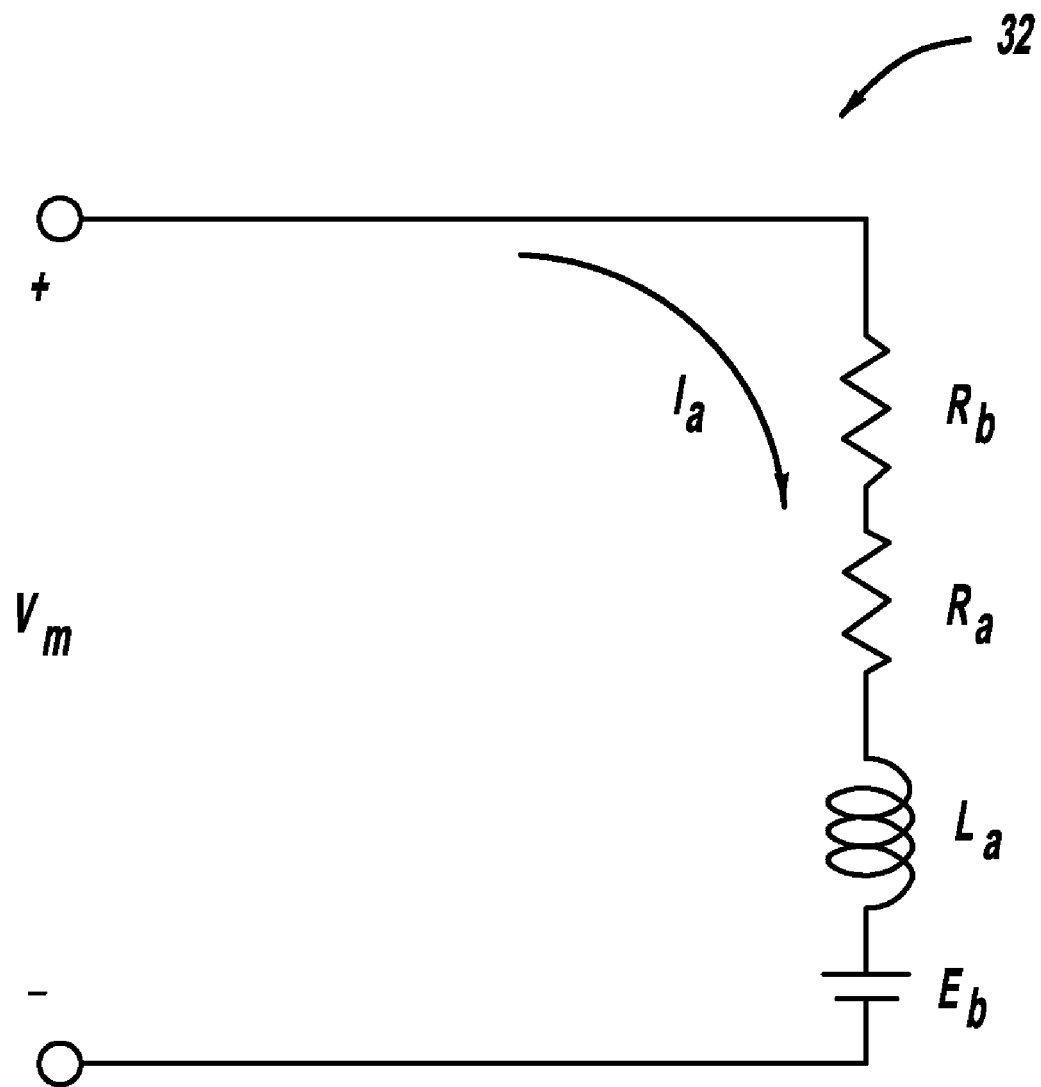
FIG. 2 is a schematic diagram of the electrical circuit of the starter motor shown in FIG. 1.

FIG. 2 is schematic diagram of an equivalent electrical circuit 32 of the starter motor 16. The armature current $I_a$ from the starter motor 16 flows from a positive terminal to a negative terminal through the electrical components in the circuit 32. The electrical circuit 32 includes a resistance $R_b$ that is the electrical resistance of the brushes of the starter motor 16. The circuit 32 also includes a resistance $R_a$ that is the resistance of the armature coil within the starter motor 16. Further, the circuit 32 includes an inductance $L_a$ that is the inductance of the armature coil in the motor 16. Also, the circuit 32 includes a back EMF represented by voltage $E_b$ that is a function of the rotational speed of the shaft 20. The starter motor 16 may fail as a result of a dirty or bad brush, which will change the resistance $R_b$, or a short circuit of the armature coil, which will decrease the inductance $L_a$ and decrease a back EMF motor constant $K_m$, or a degradation of the permanent magnet in the starter motor 16 will produce a weakened magnetic field, which will decrease the back EMF motor constant $K_m$.

As will be discussed below, the state of health of the starter motor 16 will be determined based on these three values, particularly, a resistance value $R_m$, the inductance $L_a$ and the back EMF $E_b$ defined as:

$$R_m = (R_a + R_b) \tag{1}$$

$$L_m = L_a \tag{2}$$

$$E_b = K_m T_S \omega_E \tag{3}$$

Where $K_m$ is the back EMF motor constant, $T_S$ is the gear ratio between the rotation of the shaft 20 and the shaft 22 and $\omega_E$ is the rotational speed of the shaft 22, and where $\omega_S = T_E \omega_E$, where $\omega_S$ is the rotational speed of the shaft 20.

The starter motor current and voltage behavior can be defined by a continuous time model as:

$$L_m \frac{dI_a}{dt} = -R_m I_a + V_m - K_m T_S \omega_E \tag{4}$$

This voltage/current relationship can be discretized for a fixed sampling time $\Delta t$ as:

$$I_a(k) = \left(1 - \frac{\Delta t R_m}{L_m}\right) I_a(k-1) + \frac{\Delta t}{L_m} V_m(k-1) - \frac{\Delta t}{L_m} K_m T_S \omega_E(k-1) \tag{5}$$

From this, the following model parameters $p_1, p_2$ and $p_3$ can be defined, and can be given nominal values from which a determination of the starter motor health can be provided.

$$p_1 = \left(1 - \frac{\Delta t R_m}{L_m}\right) \tag{6}$$

$$p_2 = \frac{\Delta t}{L_m} \tag{7}$$

$$p_3 = \frac{\Delta t}{L_m} K_m T_S \tag{8}$$

The model parameters $p_1, p_2$ and $p_3$ can be estimated from the starter current $I_a$, the starter voltage $V_m$ and the engine RPM $\omega_E$.

As will be discussed below, motor parameters are estimated to determine the state of health of the starter motor 16. In one embodiment a regression model is first defined as:

$$y(t) = \varphi^T(k) \theta \tag{9}$$

$$\text{Where,} \quad y(k) = I_a(k) \tag{10}$$

$$\varphi^T(k) = \{I_a(k-1), V_m(k-1), -\omega_E(k-1)\} \tag{11}$$

$$\theta = \begin{Bmatrix} p_1 \\ p_2 \\ p_3 \end{Bmatrix} \tag{12}$$

From the regression model of equations (9), (10) and (11), a recursive least square algorithm with exponential forgetting can be defined as:

$$\hat{\theta}(k) = \hat{\theta}(k-1) + P(k)\varphi(k)\big(y(k) - \varphi^T(k)\hat{\theta}(k-1)\big) \tag{13}$$

$$P(k) = \frac{1}{\lambda}\left[P(k-1) - \frac{P(K-1)\varphi(k)\varphi^T(k)P(k-1)}{\lambda + \varphi^T(k)P(k-1)\varphi(k)}\right] \tag{14}$$

According to another embodiment of the present invention, the regression model is defined in matrix form as:

$$Y = \Phi \theta \tag{15}$$

The vector and matrix of this regression model can be defined as:

$$Y = \begin{Bmatrix} I_a(t_2) \\ I_a(t_3) \\ \vdots \\ I_a(t_n) \end{Bmatrix} \Phi \begin{bmatrix} I_a(t_1) & V_m(t_1) & -\omega_E(t_1) \\ I_a(t_2) & V_m(t_2) & -\omega_E(t_2) \\ \vdots & \vdots & \vdots \\ I_a(t_{n-1}) & V_m(t_{n-1}) & -\omega_E(t_{n-1}) \end{bmatrix} \tag{16}$$

This regression model can be solved using a batch least squares algorithm as:

$$\hat{\theta} = [\Phi^T \Phi]^{-1} \Phi^T Y \tag{17}$$

From either of the regression models referred to above, motor parameters $R_m$, $K_m$ and $L_m$ can be estimated as:

$$R_m = \frac{p_1 - 1}{p_2} \tag{18}$$

$$K_m = \frac{p_3}{p_2} \tag{19}$$

$$L_m = \frac{p_2}{\Delta t} \tag{20}$$

In one embodiment, the motor parameters $R_m$, $K_m$ and $L_m$ are stored in a memory in the form of a temperature based look-up table as $R_m^o(T)$, $K_m^o(T)$ and $L_m^o(T)$.

From the motor parameters $R_m$, $K_m$ and $L_m$, an error e can be defined as:

$$e = \max\left\{ w_R \left| \frac{\hat{R}_m - K_m^O(T)}{R_m^O(T)} \right|, w_K \left| \frac{\hat{K}_m - K_m^O(T)}{\hat{K}_m} \right|, w_L \left| \frac{\hat{L}_m - L_m^O(T)}{\hat{L}_m} \right| \right\} \tag{21}$$

Where, $w_R$ is a weighting factor for the resistance motor parameter $R_m$, $w_K$ is a weighting factor for the back EMF constant motor parameter $K_m$ and $w_L$ is a weighting factor for the inductance motor parameter $L_m$, where the weighting factor is given an optimal result.

Thus, any changes in the motor resistance $R_m$, the motor constant $K_m$ and the inductance $I_m$ is captured in the error equation (21). By establishing an error threshold $e_{Th}$, a warning signal can be given to the vehicle driver, such as a light on the dashboard, telling the vehicle driver that the state of health of the starter motor 16 is reduced, which may cause it to fail in the future. Equation (22) below gives the state of health $SOH_{starter}$ of the starter motor 16 based on the error signal e as a percentage. This value is output from the controller 30.

$$SOH_{Starter} = \frac{e_{TH} - e}{e_{TH}} \times 100 \tag{22}$$

Figure 3:
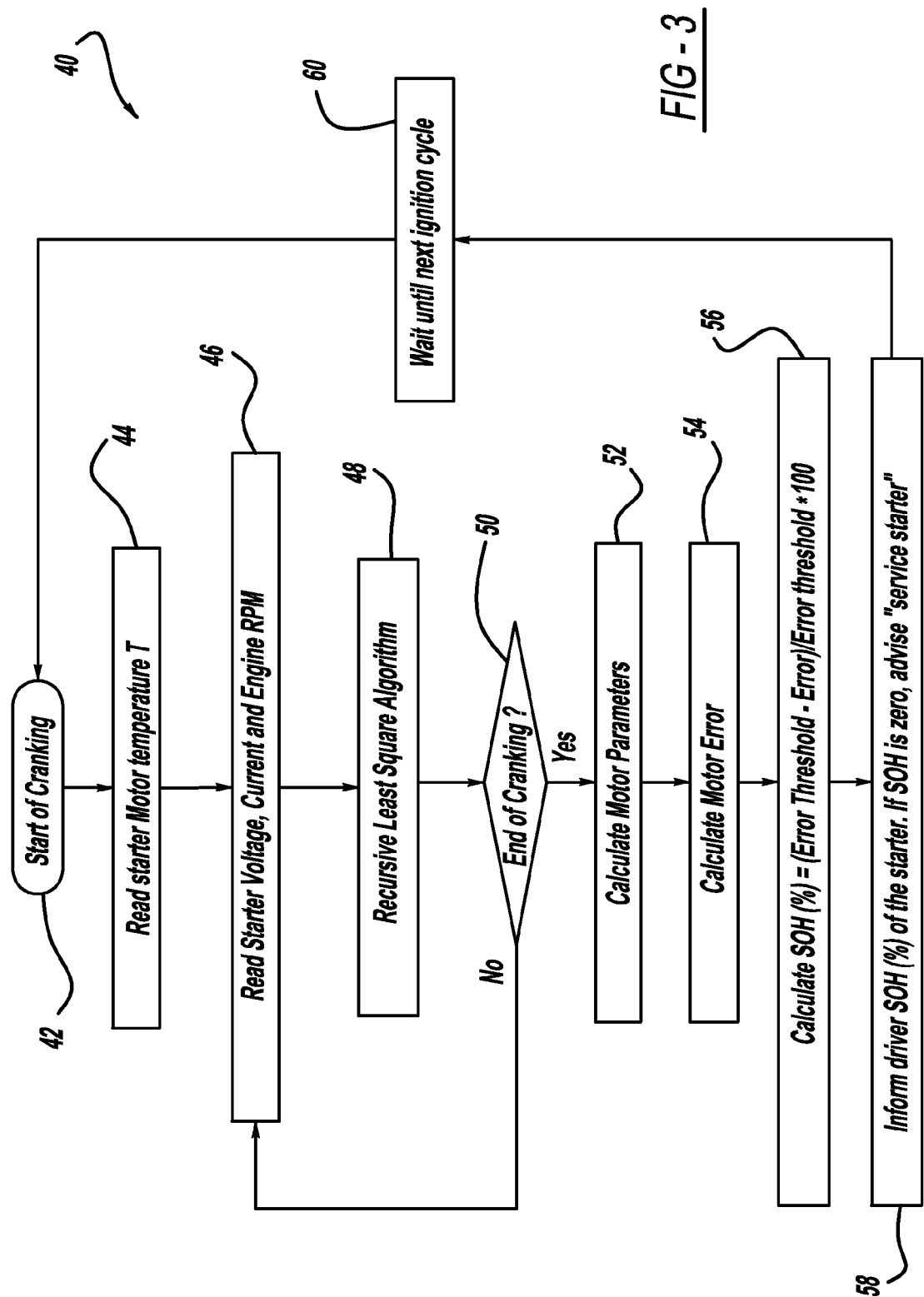
FIG. 3 is a flow chart diagram showing a process for determining starter motor diagnosis and prognosis to determine the starter motor state of health that uses a recursive least squares regression model.

FIG. 3 is a flow chart diagram 40 showing one process for determining the state of health of the starter motor 16 using the recursive least squares algorithm, discussed above. The starter motor 16 is operational when the ignition starter is turned on and the motor 16 is cranked, so that is the time when signals are available from the starter motor 16. The algorithm determines whether the starter motor 16 has started cranking at box 42, and then reads the starter motor temperature T at box 44. The algorithm then reads the starter voltage $V_m$, the starter current $I_a$ and the engine RPM $\omega_E$ at box 46. The algorithm then uses the regression model of equations (9)-(12) and the recursive least squares algorithm of equations (13) and (14) at box 48. Once the algorithm has determined the regression model and recursive least squares algorithm, it determines whether the cranking has ended at decision diamond 50, and if not, returns to the box 46 to read the starter voltage $V_m$, the starter current $I_a$ and the engine RPM $\omega_E$. If the starter motor 16 has finished being cranked and the engine has started, then the algorithm calculates the motor parameters of equations (18), (19) and (20) at box 52, and calculates the motor error e using equation (21) at box 54. The algorithm then calculates the state of health value $SOH_{starter}$ using equation (22) at box 56 and informs the vehicle driver of the starter motor SOH and whether service is required at box 58. The algorithm then waits until the next ignition cycle at box 60.

Figure 4:
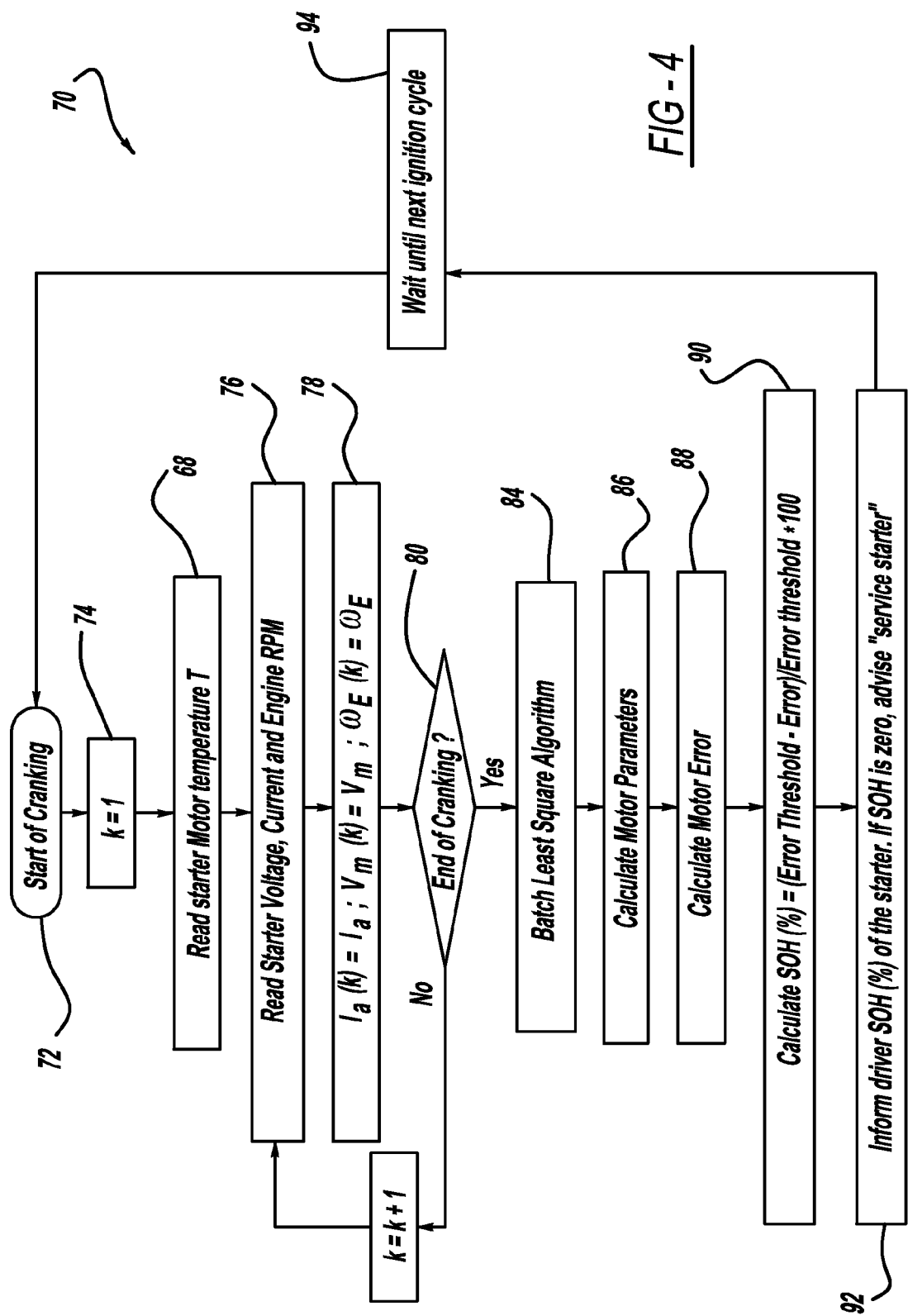
FIG. 4 is a flow chart diagram showing a process for determining starter motor diagnosis and prognosis to determine the starter motor state of health that uses a batch least squares regression model.

FIG. 4 is a flow chart diagram 70 showing a process for determining the state of health of the starter motor 16 using the batch least squares algorithm. The algorithm determines whether starter motor cranking has begun at box 72, and if so, sets a sample k=1 at box 74, and then reads the starter motor temperature T at box 68. The algorithm measures the starter voltage $V_m$, the starter current $I_a$ and the engine RPM $\omega_E$ at box 76, and then sets these values to the sample k at box 78. The algorithm then determines whether the starter motor cranking has ended at decision diamond 80, if not, adds one to the sample k at box 82 and returns to reading the starter voltage $V_m$, the starter current $I_a$ and the engine RPM $\omega_E$ at the box 76. If the starter motor cranking has ended at the decision diamond 80, then the algorithm determines the matrixes Y,φ and θ for the batch least squares algorithm using equations (15), (16) and (17) at box 84. As above, the algorithm calculates the motor parameters at box 86, the motor error e at box 88, the starter motor state of health $SOH_{starter}$ at box 90, and informs the driver of the starter state of health at box 92. The algorithm then waits until the next ignition cycle at box 94 to begin the process over.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining the state of health of a starter motor in a vehicle, said method comprising:
   using a current sensor to determine a starter motor current of the starter motor;
   using a voltage sensor to determine a starter motor voltage of the starter motor;
   providing an engine speed of an engine of the vehicle;
   identifying starter motor values that will be used to determine the state of health of the starter motor, wherein the starter motor values are a starter motor resistance that is the combination of a starter motor armature resistance and a starter motor brush resistance, a starter motor armature inductance and a back EMF motor constant;
   identifying a time model of the starter motor using the starter motor voltage, the starter motor current, the engine speed and the starter motor values;
   defining model parameters from the time model;
   providing a regression model based on the time model;
   using a controller to determine motor parameters based on the regression model;
   using the controller to determine an error using the motor parameters; and
   using the controller to compare the error to an error threshold to determine the state of health of the starter motor.

2. The method according to claim 1 wherein identifying a time model of the starter motor includes using the equation:

$$L_m \frac{dI_a}{dt} = -R_m I_a + V_m - K_m T_S \omega_E$$

where $L_m$ is the armature inductance, $I_a$ is the starter motor current, $R_m$ is the starter motor resistance, $V_m$ is the starter motor voltage, $K_m$ is the back-EMF motor constant, $T_s$ is a gear ratio between a starter motor shaft and an engine shaft and $\omega_E$ is the engine speed.

3. The method according to claim 2 wherein defining model parameters from the time model includes defining model parameters $p_1$, $p_2$ and $p_3$ as:

$$p_1 = \left(1 - \frac{\Delta t R_m}{L_m}\right)$$

$$p_2 = \frac{\Delta t}{L_m}$$

$$p_3 = \frac{\Delta t}{L_m} K_m T_S$$

where $\Delta t$ is the sampling time.

4. The method according to claim 1 wherein providing a regression model includes using a recursive least squares algorithm with exponential forgetting.

5. The method according to claim 4 wherein the regression model uses the equations:

$$y(t) = \phi^T(k)\theta$$

where $y(k) = I_a(k)$, $\phi^T(k) = \{I_a(k-1) V_m(k-1), -\omega_E(k-1)\}$, y and φ are regression model values, k is a sample, $I_a$ is the starter motor current, $V_m$ is the starter motor voltage, $\omega_E$ is the engine speed and θ represents model parameters $p_1$, $p_2$ and $p_3$.

6. The method according to claim 1 wherein providing a regression model includes using a batch least squares algorithm.

7. The method according to claim 6 wherein the regression model uses the equations:

$$Y = \Phi\theta$$

$$Y = \begin{Bmatrix} I_a(t_2) \\ I_a(t_3) \\ \vdots \\ I_a(t_n) \end{Bmatrix} \Phi \begin{bmatrix} I_a(t_1) & V_m(t_1) & -\omega_E(t_1) \\ I_a(t_2) & V_m(t_2) & -\omega_E(t_2) \\ \vdots & \vdots & \vdots \\ I_a(t_{n-1}) & V_m(t_{n-1}) & -\omega_E(t_{n-1}) \end{bmatrix}$$

$$\hat{\theta} = [\Phi^T\Phi]^{-1}\Phi^T Y$$

where Y and Φ are regression model values, $I_a$ is the started motor current, $V_m$ is the starter motor voltage, $\omega_E$ is the engine speed and θ is the model parameters.

8. The method according to claim 1 wherein the motor parameters $R_m$, $K_m$ and $L_m$ are defined by the equations:

$$R_m = \frac{p_1 - 1}{p_2}$$
$$K_m = \frac{p_3}{p_2}$$
$$L_m = \frac{p_2}{\Delta t}$$

where $p_1$, $p_2$ and $p_3$ are the model parameters and $\Delta t$ is the sampling time.

9. The method according to claim 1 wherein the motor parameters are stored as a temperature in a look-up table.

10. The method according to claim 9 wherein determining an error includes determining an error using the equation:

$$e = \max\left\{ w_R \left| \frac{\hat{R}_m - K_m^O(T)}{R_m^O(T)} \right|, w_K \left| \frac{\hat{K}_m - K_m^O(T)}{\hat{K}_m} \right|, w_L \left| \frac{\hat{L}_m - L_m^O(T)}{\hat{L}_m} \right| \right\}$$

where $R_m$ is a resistance motor parameter, $K_m$ is a back EMF motor constant parameter, $L_m$ is an inductance motor parameter, $w_R$ is a rating factor for the resistance motor parameter $R_m$, $W_K$ is a rating factor for the back EMF constant motor parameter $K_m$, $w_L$, is a rating factor for the inductance motor parameter $L_m$, $K_m^o$ is the back EMF motor constant parameter based on temperature, $R_m^o$ is the resistance motor parameter based on temperature and $L_m^o$ is the inductance motor parameter based on temperature.

11. A method for determining the state of health of a starter motor in a vehicle, said method comprising:
using a current sensor to determine a starter motor current of the starter motor;
using a voltage sensor to determine a starter motor voltage of the starter motor;
providing an engine speed of an engine of the vehicle;
identifying a starter motor resistance that is a combination of a starter motor armature resistance and a starter motor brush resistance;
identifying a starter motor armature inductance;
identifying a back EMF motor constant;
identifying a time model of the starter motor using the starter motor voltage, the starter motor current, the engine speed, the starter motor resistance, the starter motor armature inductance and the back EMF motor constant;
defining model parameters from the time model;
providing a regression model based on the time model;
using a controller to determine motor parameters $R_m$, $K_m$ and $L_m$ as $$R_m = \frac{p_1 - 1}{p_2}, K_m = \frac{p_3}{p_2} \text{ and } L_m = \frac{p_2}{\Delta t}$$

based on the regression model, where $p_1$, $p_2$ and $p_3$ are the model parameters, $R_m$ is a resistance motor parameter, $K_m$ is a back EMF constant motor parameter and $L_m$ is an inductance motor parameter;

using the controller to determine an error using the motor parameters; and
using the controller to compare the error to an error threshold to determine the state of the health of the starter motor.

12. The method according to claim 11 wherein identifying a time model of the starter motor includes using the equation:

$$L_m \frac{dI_a}{dt} = -R_m I_a + V_m - K_m T_S \omega_E$$

where $I_a$ is the starter motor current, $V_m$ is the starter motor voltage, $T_s$ is a gear ratio between a starter motor shaft and an engine shaft and $\omega_E$ is the engine speed.

13. The method according to claim 11 wherein providing a regression model includes using a recursive least squares algorithm with exponential forgetting.

14. The method according to claim 11 wherein providing a regression model includes using a batch least squares algorithm.

15. A method for determining the state of health of a starter motor in a vehicle, said method comprising:
using sensors to determine a starter motor voltage and a starter motor current of the starter motor;
identifying a time model of the starter motor using a the starter motor voltage, a the starter motor current, an engine speed, a starter motor resistance, a starter motor armature inductance and a back EMF motor constant;
defining model parameters from the time model; and
using the model parameters in a controller to determine an error that is used to determine the state of health of the starter motor.

16. The method according to claim 15 further comprising providing a regression model based on the time model, said regression model being used to convert the model parameters to the error.

17. The method according to claim 16 wherein providing a regression model includes using a recursive least squares algorithm with exponential forgetting.

18. The method according to claim 16 wherein providing a regression model includes using a batch least squares algorithm.

19. The method according to claim 15 wherein identifying a time model of the starter motor includes using the equation:

$$L_m \frac{dI_a}{dt} = -R_m I_a + V_m - K_m T_S \omega_E$$

where $L_m$ is the armature inductance, $I_a$ is the starter motor current, $R_m$ is the starter motor resistance, $V_m$ is the starter motor voltage, $K_m$ is the back-EMF motor constant, $T_s$ is a gear ratio between a starter motor shaft and an engine shaft and $\omega_E$ is the engine speed.

20. A method for determining the state of health of a starter motor in a vehicle, said method comprising:
using a current sensor to determine a starter motor current of the starter motor;
using a voltage sensor to determine a starter motor voltage of the starter motor;
providing an engine speed of an engine of the vehicle;
identifying starter motor values that will be used to determine the state of health of the starter motor;

identifying a time model of the starter motor using the starter motor voltage, the starter motor current, the engine speed and the starter motor values;
defining model parameters from the time model;
providing a regression model based on the time model;
using a controller to determine motor parameters based on the regression model, wherein the motor parameters are stored as a temperature in a look-up table;
using the controller to determine an error using the motor parameters; and
using the controller to compare the error to an error threshold to determine the state of health of the starter motor.

* * * * *